(12) United States Patent  (10) Patent No.: US 8,753,725 B2
Wei et al.  (45) Date of Patent: *Jun. 17, 2014

(54) METHOD FOR PLASMA IMMERSION ION PROCESSING AND DEPOSITING COATINGS IN HOLLOW SUBSTRATES USING A HEATED CENTER ELECTRODE

(75) Inventors: Ronghua Wei, San Antonio, TX (US); Richard L. Johnson, San Marcos, TX (US); Christopher Rincon, San Antonio, TX (US); Michael A. Miller, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 539 days.

This patent is subject to a terminal disclaimer.

(21) Appl. No.: 13/046,181

(22) Filed: Mar. 11, 2011

(65) Prior Publication Data

US 2012/0231177 A1  Sep. 13, 2012

(51) Int. Cl.
 *H05H 1/24*  (2006.01)
(52) U.S. Cl.
 USPC .......................................... 427/570; 427/523
(58) Field of Classification Search
 USPC .......................... 427/570, 574, 577, 578, 523
 See application file for complete search history.

(56) References Cited

U.S. PATENT DOCUMENTS

| | | |
|---|---|---|
| 4,374,722 A | 2/1983 | Zega |
| 4,377,773 A | 3/1983 | Hershcovitch et al. |
| 4,407,712 A | 10/1983 | Henshaw et al. |
| 4,520,268 A | 5/1985 | Xu |
| 4,680,197 A | 7/1987 | Sagoi et al. |
| 4,731,539 A | 3/1988 | Xu |
| 4,764,394 A | 8/1988 | Conrad |
| 4,795,942 A | 1/1989 | Yamasaki |

(Continued)

FOREIGN PATENT DOCUMENTS

| | | |
|---|---|---|
| AU | 2008256944 | 4/2013 |
| JP | 02205666 A | 8/1990 |

(Continued)

OTHER PUBLICATIONS

Lusk, D., et al., "A High Density Hollow Cathode Plasma PECVD Technique for Depositing Films on the Internal Surfaces of Cylindrical Substrates". Plasma Processes and Polymers, 2009, 6, S429-S432.*

(Continued)

*Primary Examiner* — Bret Chen
(74) *Attorney, Agent, or Firm* — Grossman, Tucker et al (57) ABSTRACT

A method for plasma immersion ion processing including providing a hollow substrate having an interior surface defining an interior and a gas feed tube extending through the interior, wherein the gas feed tube is hollow and includes a wall having a plurality of holes defined therein and applying tension to said gas feed tube by affixing a spring to one end of said gas feed tube and said vacuum chamber. The method may also include heating the gas feed tube to a temperature in the range of 50° C. to 650° C.; supplying a precursor gas to the interior of the hollow substrate through the plurality of holes in the gas feed tube and generating a plasma; and applying a negative bias to the hollow substrate relative to the gas feed tube to draw ions from the plasma to the interior surface to form a coating on the interior surface.

10 Claims, 10 Drawing Sheets

(56) References Cited

U.S. PATENT DOCUMENTS

| | | | |
|---|---|---|---|
| 5,249,554 | A | 10/1993 | Tamor et al. |
| 5,458,927 | A | 10/1995 | Malaczynski et al. |
| 5,483,121 | A | 1/1996 | Okagaki et al. |
| 5,593,798 | A | 1/1997 | Muller et al. |
| 5,605,714 | A | 2/1997 | Dearnaley et al. |
| 5,725,573 | A | 3/1998 | Dearnaley et al. |
| 6,055,928 | A | 5/2000 | Murzin et al. |
| 6,087,025 | A | 7/2000 | Dearnaley et al. |
| 6,120,660 | A | 9/2000 | Chu et al. |
| 6,182,604 | B1 | 2/2001 | Goeckner |
| 6,410,144 | B2 | 6/2002 | Dearnaley et al. |
| 6,497,803 | B2 | 12/2002 | Glocker et al. |
| 6,514,565 | B2 | 2/2003 | Dearnaley et al. |
| 6,524,538 | B2 | 2/2003 | Barankova et al. |
| 6,572,933 | B1 | 6/2003 | Nastasi et al. |
| 6,632,482 | B1 | 10/2003 | Sheng |
| 6,767,436 | B2 | 7/2004 | Wei et al. |
| 6,878,404 | B2 | 4/2005 | Veerasamy et al. |
| 6,893,907 | B2 | 5/2005 | Maydan et al. |
| 6,997,202 | B2 * | 2/2006 | Olander ............................ 137/2 |
| 7,040,521 | B2 * | 5/2006 | Kolodziej et al. ............... 227/10 |
| 7,052,736 | B2 | 5/2006 | Wei et al. |
| 7,094,670 | B2 | 8/2006 | Collins et al. |
| 7,300,684 | B2 | 11/2007 | Boardman et al. |
| 8,029,875 | B2 * | 10/2011 | Wei et al. ....................... 427/570 |
| 2001/0009225 | A1 | 7/2001 | Leyendecker et al. |
| 2004/0025454 | A1 | 2/2004 | Burgess |
| 2004/0055870 | A1 | 3/2004 | Wei |
| 2004/0084152 | A1 | 5/2004 | Gregoire et al. |
| 2004/0254545 | A1 * | 12/2004 | Rider et al. .................... 604/265 |
| 2005/0061251 | A1 | 3/2005 | Wei et al. |
| 2005/0287307 | A1 | 12/2005 | Singh et al. |
| 2006/0011468 | A1 * | 1/2006 | Boardman et al. ....... 204/192.12 |
| 2006/0076231 | A1 | 4/2006 | Wei |
| 2006/0076235 | A1 | 4/2006 | Wei |
| 2006/0121704 | A1 | 6/2006 | Walther et al. |
| 2006/0196419 | A1 | 9/2006 | Tudhope et al. |
| 2006/0198965 | A1 | 9/2006 | Tudhope et al. |
| 2006/0251917 | A1 | 11/2006 | Chiang et al. |
| 2006/0264060 | A1 * | 11/2006 | Ramaswamy et al. ......... 438/758 |
| 2008/0292806 | A1 * | 11/2008 | Wei et al. ....................... 427/452 |
| 2009/0120367 | A1 * | 5/2009 | Porshnev et al. .......... 118/723 E |
| 2009/0176035 | A1 * | 7/2009 | Tudhope et al. ............... 427/576 |
| 2010/0006421 | A1 | 1/2010 | Wei |
| 2011/0111132 | A1 * | 5/2011 | Wei et al. ....................... 427/523 |
| 2011/0151141 | A1 * | 6/2011 | Upadhyaya et al. ........... 427/578 |
| 2012/0045592 | A1 * | 2/2012 | Kumar et al. .................. 427/577 |

FOREIGN PATENT DOCUMENTS

| | | |
|---|---|---|
| JP | 02243766 | 9/1990 |
| JP | 63026373 A | 2/1998 |
| JP | 2003-279917 * | 10/2003 |

OTHER PUBLICATIONS

Casserly, T., et al., "Investigation of DLC-Si Film Deposited Inside a 304SS Pipe Using a Novel Hollow Cathode Plasma Immersion Ion Processing Method". 2007 Society of Vacuum Coaters, 50th Annual Technical Conference Proceedings (2007) ISSN 0737-5921, pp. 59-62.*

Lusk, D., et al., "A hollow cathode high density plasma process for internally coating cylindrical substrates". No date, no pages, no citation information available.*

Search Report dated Jul. 5, 2012 issued in related European Patent Application No. 08756039.7 (8 pgs).

T.Casserly, et al; "Investigation of DLC-Si Film Deposited Inside a 304SS Pipe Usuing A Novel Hollow Cathode Plasma Immersion Ion Processing Method"; 2007 Society of Vacuum Coaters 505/895-7188; 50th Annual Technical Conference Proceedings (2007) ISSN 0737-5921; pp. 59-62.

Chen, et al., "Development and Characterization of Micromachined Hollow Cathode Plasma Display Devices," Journal of Microelectromechanical Systems, vol. 11, No. 5, Oct. 2002, pp. 536-543.

Anders, "From Plasma Immersion Ion Implantation to Deposition: A Historical Perspective on Principles and Trends," Surface and Coatings Technology, vol. 156, Issues 1-3, Jul. 1, 2002, pp. 3-12.

Kostov, et al., "Two Dimensional Computer Simulation of Plasma Immersion Ion Implantation," Brazilian Journal of Physics, vol. 34, No. 4B, Dec. 2004.

"Plasma-enhanced Chemical Vapor Deposition," available at http://en.wikipedia.org/wiki/Plasma-enhanced_chemical_vapor_deposition, retrieved on May 18, 2007, 3 pages.

"Diamond-like Carbon," available at http://en.wikipedia.org/wiki/Diamond-like_carbon, retrieved on May 16, 2007, 6 pages.

Apetrei, et al., "Characterization of a Modified Hollow-cathode Discharge Plasma by Optical Means," 32nd EPS Conference of Plasma Phys. Tarragona, Jun. 27-Jul. 1, 2005 ECA vol. 29C, P-4 139 (2205), 4 pages.

Shader, et al., "Hollow Cathode Lamps—Yesterday, Today and Tomorrow," Mar. 1999, available a https://www.varianic.com/media/sci/apps/a-aa14.pdf, retrieved on May 15, 2008, 7 pages.

"Plasma Immersion Ion implantation (PI3)—The Technology, Applications and Success to Date," Materials Australia, vol. 34, No. 1, p. 9, Jan./Feb. 2002, available at http://www.azom.com/details.asp?ArticleID=2090, retrieved on May 16, 2007, 3 pages.

"Plasma Immersion Ion Processing," 18-Steam Turbine Technology Brochure, available at http://www.swri.org/3pubs/brochure/d18/plasma/plasma.htm, retrieved on May 16, 2007, 2 pages.

"Hollow Cathodes," available at http://www.engr.colostate.edu/ionstand/research_hollowcathods.html, retrieved on May 17, 2007, 3 pages.

"Hollow Cathode Plasma Source," available at http://www.vtd.de/en/produkte/komponenten/ko_ref2.php, retrieved on May 17, 2007, 1 page.

"Cold War Against Hydrates," available at http://www.ntnu.no/gemini/2003-06e/28-31.htm. retrieved on May 16, 2007, 5 pages.

Wei, "A novel High-Intensity Metal Ion Source for Plasma Immersion Implantation and Deposition (MPIII&D) 18-9292," available at http://www.swri.org/3pubs/IRD2003/Synopses/189292.htm, retrieved on May 16, 2007, 2 pages.

"SwRI Surface Modification Facility Offers Two New Capabilities," available at http://www.swri.org/9what/releases/2000/PIIP.htm, retrieved on May 16, 2007, 2 pages.

Monaghan, et al. "Diamond-Like Carbon Coatings," Materials World, vol. 1 No. 6 pp. 347-349, Jun. 1993, available at http://www.azom.com/details.asp?ArticleID=623, retrieved on May 16, 2007.

International Search Report and Written Opinion dated Aug. 26, 2008 issued in related International Patent Application No. PCT/US08/64344.

U.S. Office Action dated May 25, 2010 issued in related U.S. Appl. No. 11/752,787.

U.S. Office Action dated Sep. 15, 2009 issued in related U.S. Appl. No. 11/752,787.

Hosokawa, et al., "Self-sputtering phenomena in high-rate coxial cylindrical magnetron sputtering," J. Vac. Sci. Technol., vol. 14, No. 1, Jan./Feb. 1997, pp. 143-146.

Xu, et al. "Double glow plasma surface alloying and plasma nitride," Surface and Coating Technology vol. 201, Issue 9-11, Feb. 2007, pp. 4822-4825 (abstract enclosed).

Wei, et al., "Magnetic field enhanced plasma (MFEP) deposition of inner surfaces of tubes", Surface and Coatings Technology 188-189 (2004) pp. 691-696.

Tian, et al., "Theoretical investigation of plasma immersion ion implantation of cylindrical bore using hollow cathode plasma dischage", Surface and Coatings Technology 203 (2009) pp. 2727-2730.

Zizka, "Plasma deposition of thin metal layers in the discharge with a hollow target", Czech. J. Phys. B 33 (1983), pp. 14-24.

U.S. Office Action dated May 11, 2011 issued in related U.S. Appl. No. 12/169,837 (11 pgs).

U.S. Office Action dated Dec. 21, 2011 issued in related U.S. Appl. No. 12/169,837 (13 pgs).

Examiner's Report dated Dec. 7, 2011 issued in related Australian Patent Application No. 2008256944.

(56) References Cited

OTHER PUBLICATIONS

U.S. Office Action dated Nov. 2, 2012 issued in related U.S. Appl. No. 12/169,837 (15 pgs).

U.S. Office Action dated Jul. 15, 2013 issued in related U.S. Appl. No. 12/169,837 (17 pgs).

European office Action dated Sep. 2, 2013 issued in related EP Patent Application No. 08756039.7 (4 pgs).

* cited by examiner

METHOD FOR PLASMA IMMERSION ION PROCESSING AND DEPOSITING COATINGS IN HOLLOW SUBSTRATES USING A HEATED CENTER ELECTRODE

FIELD OF INVENTION

The present application relates to depositing coatings on the internal surfaces of long hollow substrates using a heated center electrode.

BACKGROUND

The interior surface of long hollow substrates (30-40 ft in length) such as those used in the oil or gas industry may employ various coatings for corrosion, erosion, abrasion and sliding wear protection. In addition, other functionality such as good hydrophobicity (water contact angle, WCA>=90°, super hydrophobicity (WCA~150°), or ice-phobicity may be useful. Using the current technology plasma immersion ion processing (PIIP) or plasma immersion ion deposition (PhD), hollow substrates up to 20 ft and 4 inches in diameter, or having up to a 60:1 length to diameter ratio, may be deposited with diamond like coating (DLC) or other Si-containing and F-containing hydrocarbon coatings.

However, in processing hollow substrates having a length to diameter ratio of greater than 60:1 for hollow substrate diameters 3 inches or greater, or length to diameter ratios of 48:1 for hollow substrate diameters under 3 inches, uneven plasma distribution occurs inside the hollow substrate as to cause the coating to be so uneven that the center regions typically remain uncoated. This may be because electrons generated inside a hollow substrate biased at a negative potential have to travel out to the vacuum chamber wall (ground) to complete the current flow loop while ions generated from the electron-neutral impact ionization have to go to the hollow substrate wall to complete the current flow loop. The electrons generated near the ends can make it out of the hollow substrate while the electrons generated in deeper regions near the center of the hollow substrate may not travel too far because the electric field is much weaker and the electrons lose the energy nearly completely due to the electron-neutral molecule collisions. As a result, the density of the plasma may be much stronger near the hollow substrate ends and approach zero near the center of the hollow substrate. The result may be that little to no film may be deposited approaching the center of the hollow substrate. Furthermore, coating uniformity may also be affected by the placement and number of pumping stations affixed to a hollow substrate, gas flow rate, pumping speed, etc.

In addition, center electrodes may be used in hollow substrates to increase plasma density uniformity, but not without reported problems. For example, the center electrodes currently sag. In addition, when depositing films including carbon, the center electrode reportedly are coated with a sooty carbon coating, which will typically have adverse effects, such as an increase in the resistivity of the electrode. Loose carbon particles may also randomly fall from the center electrode onto the hollow substrate, which will cause arcing inside the hollow substrate creating holes in the deposited coatings or blocking further deposition causing uneven coatings.

SUMMARY

An aspect of the present disclosure relates to a method for plasma immersion ion processing. The method may include providing a hollow substrate having an interior surface defining an interior and a gas feed tube extending through the interior, wherein the gas feed tube may be hollow and includes a wall having a plurality of holes or diffusers defined therein. The method may also include heating the gas feed tube to a temperature in the range of 50° C. to 650° C., supplying a precursor gas to the interior of the hollow substrate through the plurality of holes or diffusers in said gas feed tube and generating a plasma. The method may further include applying a negative bias to the hollow substrate relative to the gas feed tube to draw ions from the plasma to the interior surface to form a coating on the interior surface.

Another aspect of the present disclosure relates to a system for plasma immersion ion processing. The system may include a hollow substrate having an interior surface defining an interior and a gas feed tube passing through the interior of the hollow substrate, wherein the gas feed tube may be hollow and includes a wall having a plurality of holes or diffusers defined therein. The system may also include a vacuum system including a first vacuum chamber in fluid communication with the interior of the hollow substrate. The system may further include a power supply coupled to the hollow substrate configured to provide a pulsed voltage to bias the hollow substrate relative to the gas feed tube to draw ions from a plasma to the interior surface of the hollow substrate and a transformer coupled to the gas feed tube configured to provide AC power to the gas feed tube and heat the gas feed tube to a temperature in the range of 50° C. to 650° C.

BRIEF DESCRIPTION OF DRAWINGS

The above-mentioned and other features of this disclosure, and the manner of attaining them, may become more apparent and better understood by reference to the following description of embodiments described herein taken in conjunction with the accompanying drawings, wherein.

DETAILED DESCRIPTION

The present application relates to depositing coatings on the internal surfaces of long hollow substrates, such as pipes, using a heated center electrode. The deposited coatings, described further herein may include, but are not necessarily limited to, diamond-like carbon (DLC) coatings or variations thereof, such as coatings including carbon precursors. Bond coats may also be applied to the hollow substrate prior to or in combination with the DLC coating.

In particular, the present disclosure relates to depositing coatings on the interior of long hollow substrates. The hollow substrates may be up to eighty (80) feet in length and may be coated using the system provided herein, wherein the hollow substrate length may range from 2 inches to 80 feet, including all values therein in 1 foot increments, up to 80 feet, such as 1 foot (12 inches), 2 feet (24 inches), 3 feet (36 inches), up to 80 feet. In addition, the hollow substrates may be in any range up to 80 feet utilizing any lower level distance to set the bottom threshold of the range, such as 1 foot-80 feet, 2 feet to 80 feet, etc. By the same token, the range of the hollow substrate may be from 1 foot to 79 feet, 1 foot to 78 feet, etc.

Further, the hollow substrate may have a diameter in the range of 1 inch to 40 inches, including all values and ranges therein, such as 2 inches to 4 inches. The hollow substrates may include a number of materials, such as steel of various grades including stainless steel or carbon steel, aluminum, aluminum alloys, titanium or titanium alloys. The hollow substrates may be tubular and may include, for example, pipes. Other tubular substrates may be utilized herein as well, including those with varying internal diameters. In addition, other components, such as elbows, tees, reducers, crosses, caps, etc. may be employed in the system and methods contemplated herein.

Figure 1:
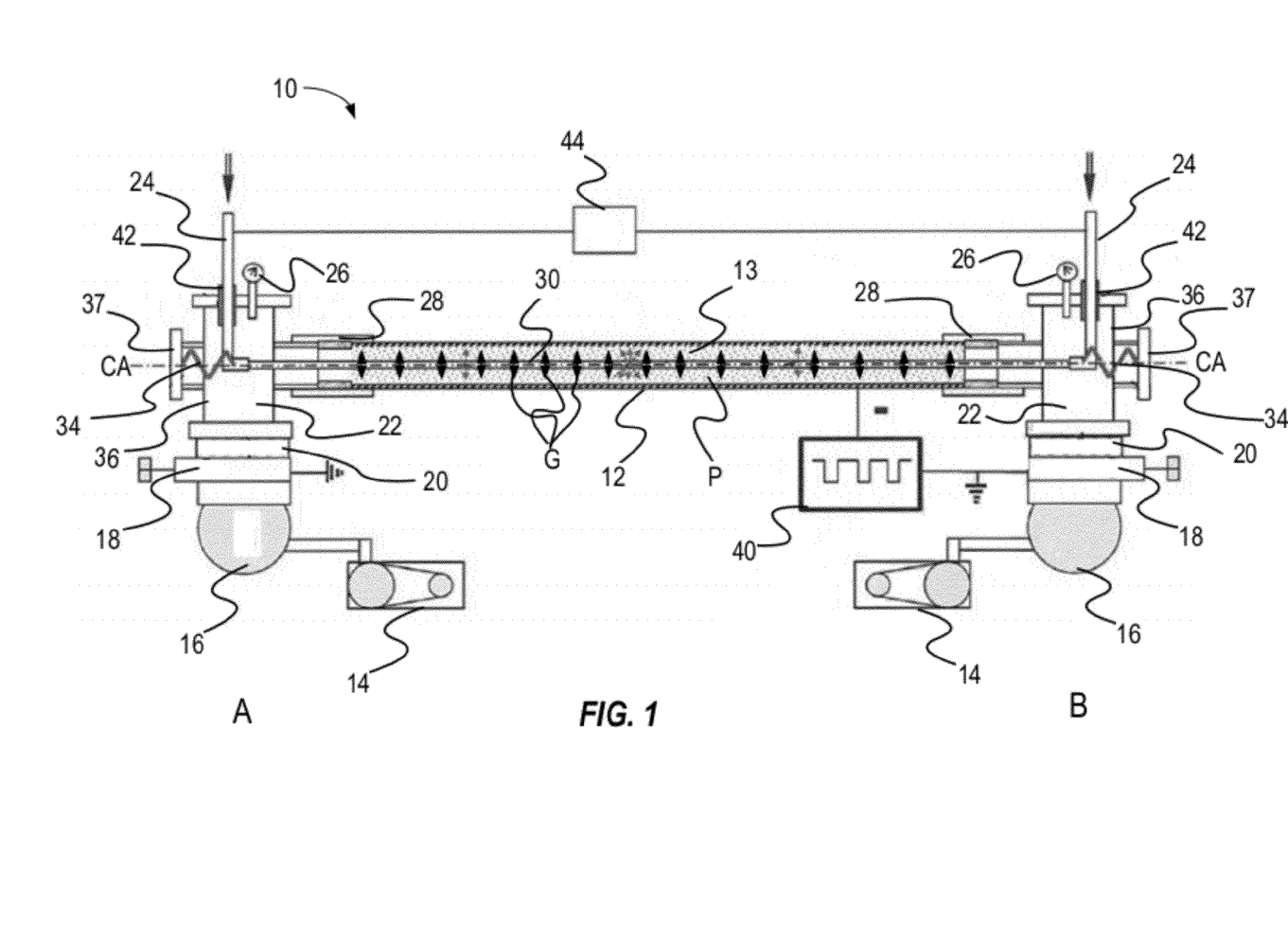
FIG. 1 illustrates a schematic of an embodiment of a system for depositing coatings on the internal surface of a hollow substrate.

FIG. 1 illustrates a schematic of an embodiment of a plasma immersion ion deposition system 10 for depositing coatings on interior surfaces of a hollow substrate 12. The system 10 may include a vacuum system which may include one or more vacuum pumps. For example, a mechanical pump 14 may be provided in addition to a high vacuum pump 16. The mechanical pump may create a partial vacuum and then, the high vacuum pump may further reduce the pressure, further increasing the vacuum. A gate valve 18 and a throttle valve 20 may be positioned between the vacuum pumps 14, 16 and the hollow substrate 12. The vacuum system may also include a vacuum chamber 22, to which the hollow substrate 12 may be affixed. Fluid communication may be provided as between the interior 13 of the hollow substrate 12 and the vacuum chamber 22 allowing for a vacuum to be provided within the interior of the hollow substrate 12. Fluid communication may be understood as one or more connections (e.g., couplings) providing the ability of a gas to flow from one region, e.g., the interior of the hollow substrate to another region, e.g., the vacuum chamber. In some embodiments, the hollow substrate 12 may be placed within a vacuum chamber 22, which surrounds the pipe 12.

The system 10 may also include a gas supply system, including a gas feed supply 24. Gauges 26 may be provided for measuring the gas pressure, vacuum pressure or both in the system 10. An electrical insulator 28 may be provided between the vacuum chamber 22 and the hollow substrate 12. Thus, while gasses may be communicated between the vacuum chamber 22 and the hollow substrate 12, electrical current may not be communicated between the hollow substrate 12 and the vacuum chamber 22.

Figure 2:
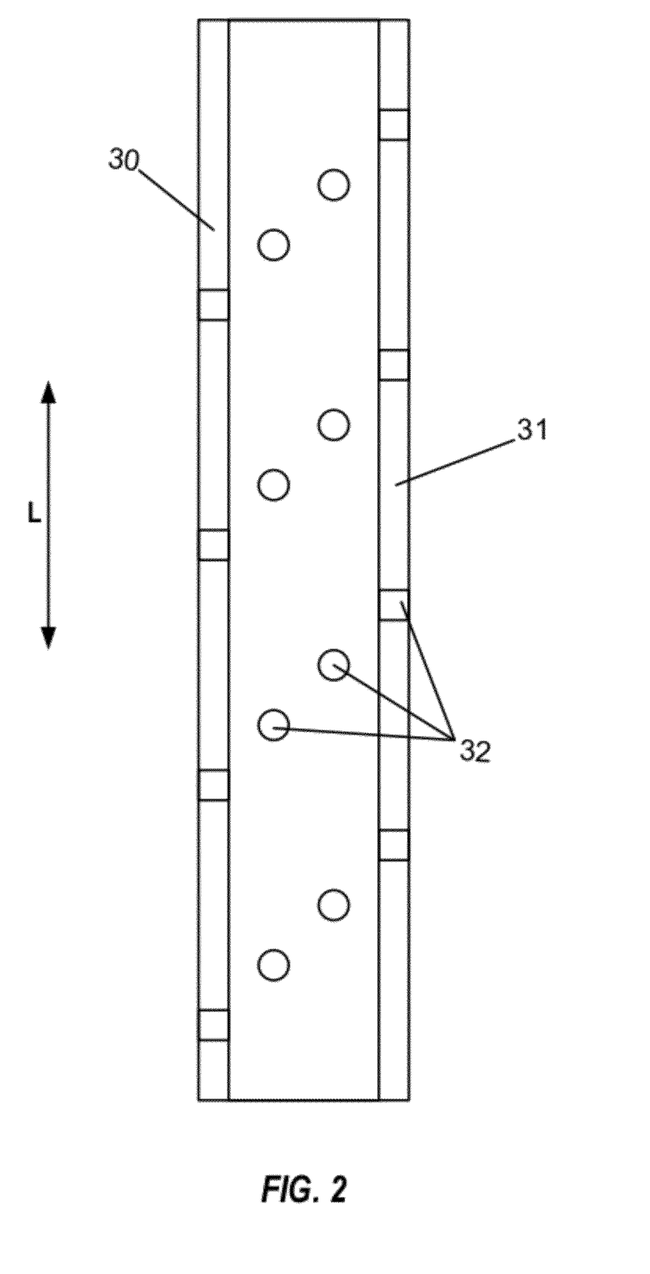
FIG. 2 illustrates a schematic of another embodiment of a system for depositing coatings on the internal surface of a hollow substrate.

A gas feed tube 30 may also be positioned within the hollow substrate 12. The gas feed tube 30 may be coupled to the gas feed supply 24, such that gas may flow from the gas feed supply to the gas feed tube 30. The gas feed tube 30 may be hollow and, in some embodiments, may be at least as long as the hollow substrate 12 and up to 10% longer than said hollow substrate 12, including all values and ranges from 1% to 10%. Accordingly, the gas feed tube may be up to 80 feet in length, and in some embodiments, up to 88 feet in length. The gas feed tube 30 may be formed from stainless steel or other materials, such as, but not limited to, nickel, titanium, tantalum or tungsten. In some embodiments, the gas feed tube 30 may be positioned in a relatively concentric manner to the hollow substrate 12 wherein the distance between the external surface of the gas feed tube 30 and the inner diameter of the hollow substrate 12 may be relatively consistent over the length of the hollow substrate. In some embodiments, the hollow substrate 12 and gas feed tube 30 may have circular, or substantially circular cross-sections. In other embodiments, the cross-sections of the hollow substrate 12 and gas feed tube 30 may be oblong, elliptical, square or rectangular. Gas, from the gas supply 24, may be fed into the hollow substrate 12 through the gas feed tube 30. As illustrated in FIG. 2, the gas feed tube 30 may include a plurality of gas feed holes 32 spaced around the gas feed tube 30 through which the gas G may pass into the hollow substrate 12. The holes 32 may be spaced evenly or randomly around the circumference or wall 31 of the gas feed tube 30, along the length L of the gas feed tube 30 or both. Gas diffusers may also be used in sections of the gas feed tube 30 which may be understood as a structure that eliminates or reduces possible plasma jets forming at the holes.

Referring again to FIG. 1, the gas feed tube 30 may be in the range of 0.1 inches to 0.5 inches in diameter, including all values and ranges therein, such as 0.125, 0.25, 0.375, etc. One or more springs 34 may be used to suspend the gas feed tube 30 and apply tension to the gas feed tube 30. The tension may be a tensile stress in the range of 5-25 psi. Each spring 34 may be affixed to opposing ends of the gas feed tube 30 and the vacuum chamber wall 36 as illustrated in FIG. 1. An insulator may be provided to isolate the spring from the vacuum chamber wall 36. The insulator 37 may include materials that resist the flow of electric charge conducting little to no electrical current. Insulator materials may include polymer materials such as polytetrafluoroethylene (PTFE) or polyvinyl chloride, ceramics, glass, etc.

Figure 3:
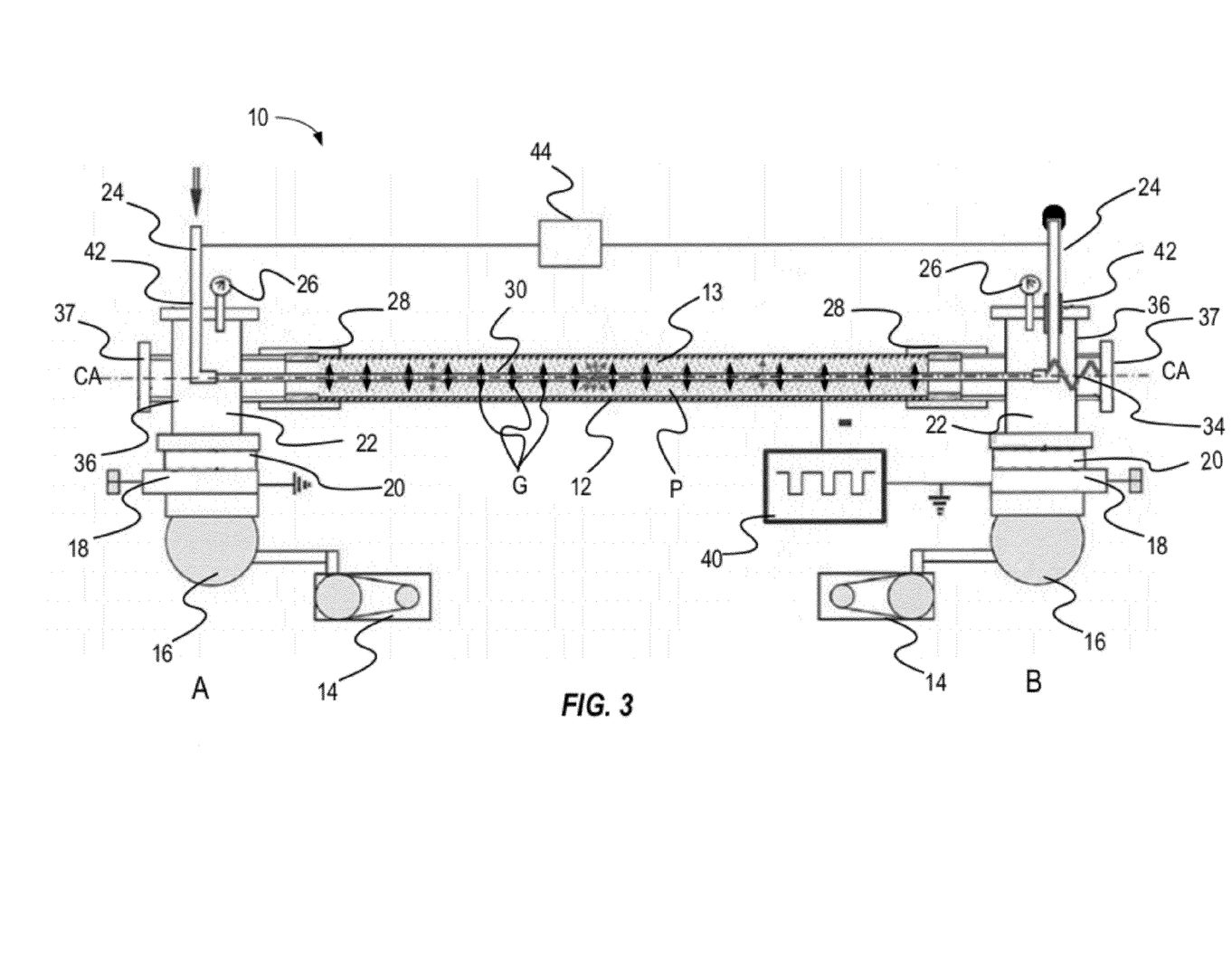
FIG. 3 illustrates a lengthwise cross-sectional view of a gas feed tube including a plurality of gas feed holes.

In other embodiments, such as illustrated in FIG. 3, a single spring 34 may be affixed to one end of the gas feed tube 30 and the vacuum chamber wall 36 and pulled in tension using screw and nut assemblies or a hand winch positioned at the other end of the gas feed tube 30. Again, a tensile stress of 5-25 psi may be applied. The springs 34 illustrated in FIGS. 1 and 3 may be selected to exhibit a spring coefficient of 1 to 20 lb per inch, including all values and ranges therein, such as 9.2 lb per inch. The springs 34 may also be coiled and exhibit a diameter in the range of 0.5 to 2.5 inches, including all values and increments therein, such as 1.25 inches. The springs 34 may also exhibit a length of 5 to 25 inches, including all values and increments therein, such as 10 inches.

The tension in the springs 34 and, therefore on the gas feed tube 30, may reduce sag in the gas feed tube 30. Sag may be understood as a deviation of the walls of the gas feed tube 30 from a straight line, such as the center axis CA of the hollow substrate 12, which may be caused by, for example, gravity. In some embodiments, the deviation may be reduced to less than a half inch for every 480 inches of the gas feed tube 30, such as 0.01 inches to 0.5 inches for every 480 inches of the gas feed tube, including all values and ranges therein. It may be appreciated that sagging may be preferably controlled to values of less than of equal to 0.50 inches, which was observed using 304 SS tubing (⅛" diameter). In such context, the level of sagging may be reduced and be acceptable provided that center electrode tubing does not contact the inner diameter of the pipe.

The gas feed tube 30 may also be employed as an electrode, i.e., a center electrode. In some embodiments, the gas feed tube 30 may be connected to ground, which may provide for the collection of electrons from the plasma P. The hollow substrate 12 may be coupled to a negative pulsed high voltage modulator 40, which may bias the hollow substrate 12 relative to the gas feed tube 30. The hollow substrate 12 may draw ions from the plasma P to the interior surface of the hollow substrate, wherein the ions may impinge on the interior surface to clean the surface or form a coating. The voltage pulses may be less than or equal to about 10 kV. The pulse frequency may be about 100 Hz to about 20 kHz, including all values and ranges therein, at a pulse width from about 5 microseconds to about 40 microseconds, including all values and ranges therein.

The gas feed tube 30 may also be heated, providing a heated electrode, as illustrated in FIGS. 1 and 3. In some embodiments, both ends of the gas feed tube 30 and springs 34 may be isolated from ground, or as alluded to above, one end of the gas feed tube 30 may be connected to ground, again to collect electrons from the plasma P generated by the high voltage pulses from the pulsed voltage modulator 40. Electric power for heating the gas feed tube 30, may be applied to the gas feed tube 30 through an electrical feed through 42. The electrical power may be supplied from a power supply 44, wherein the electrical current may heat the gas feed tube 30. In one embodiment, a variable transformer (such as a VARIAC) may be used to provide AC power to the gas feed tube 30. The AC voltage may be in the range of 10 V to 100 V, including all values and ranges therein, such as 50 V to 85 V. The current may be in the range of 20 to 50 A, including all values and ranges therein, such as 34 A or 35 A. Depending on the material or the length of the hollow substrate different voltages and current may be selected to achieve a desired gas feed tube 30 temperature. For example, 50V and 35 A may be applied to a 0.125 inch diameter hollow substrate 18 feet long made of stainless steel, 80V and 34 A may be applied to a 0.125 inch diameter hollow substrate 33 feet long, or 85 V and 35 A may be applied to a 0.125 inch diameter hollow substrate 41 feet long. Power may be applied to the gas feed tube 30 in advance of beginning the deposition process to heat the gas feed tube 30 up to a desired temperature prior to the introduction of processing gases or power may be applied to the gas feed tube 30 during select portions of the deposition process.

The gas feed tube 30 may be heated to a sufficient temperature to prevent carbonaceous molecules from condensing on the gas feed tube 30. On the other hand, a temperature that is too high may result in compromising the gas feed tube 30 and may break the tubing. Accordingly, in some embodiments, the gas feed tube 30 may be heated to a temperature in the range of 50° C. to 650° C., including all values and ranges therein, such as from 300° C. to 600° C., or 400° C. to 500° C., etc. More preferably, the range may be 350° C. to 650° C. An appropriate temperature may be selected based on factors such as the compounds utilized to form the coatings on the hollow substrate 12.

Figure 4:
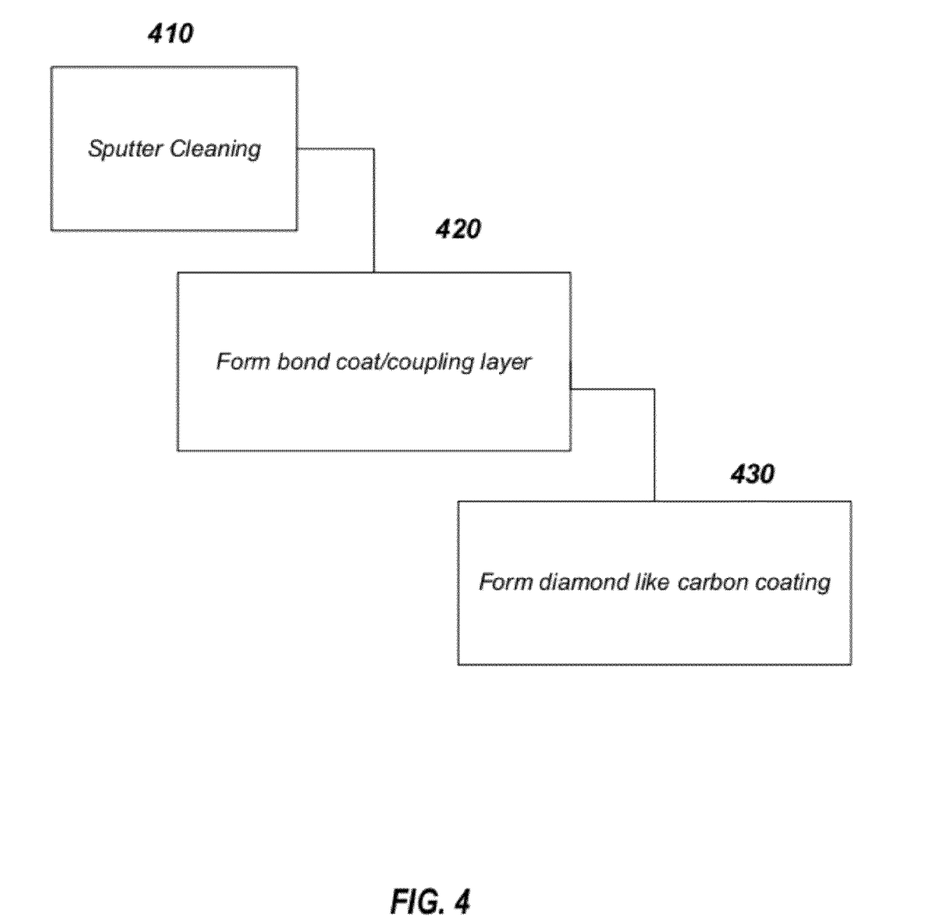
FIG. 4 illustrates an embodiment of a method of forming a coating.

An embodiment of a method of forming coatings on a hollow substrate using the above described system is illustrated in FIG. 4. Initially, a vacuum may first be developed within the hollow substrate to value of at or below about $10^{-5}$ Torr. The process may then optionally begin with sputter cleaning the interior surface of the hollow substrate in the presence of an inert gas plasma or hydrogen 410. This may substantially remove contaminants (e.g. surface oxides and organic contaminants) from the inner surface which may then provide an improved ability to undergo ion coating. Reference to surface oxides may be understood herein as compounds containing oxygen, such as a metal oxide (e.g. iron oxide, chromium oxide, or nickel oxide). It may therefore be appreciated that the cleaning step may involve the introduction of an inert gas, such as argon, neon, krypton, xenon or combinations thereof, to a pressure of about 0.5 to about 100 millitorr (mTorr) including all values and increments therein. A voltage of 10V to 100V and 30 to 40 A may be applied to the gas feed tube 30 while sputter cleaning. In addition, a pulse frequency of from about 100 Hz to about 20 kHz may be applied, at a pulse width of about 5 microseconds to about 40 microseconds, to negatively bias the tube up to about 10 kV with respect to ground, for a period of up to about 120 minutes, including all values and increments therein. For example, it has been found useful to negative bias the tube at about 2 kV for a period of about 60 minutes. A plasma of the inert gas may form within the hollow substrate and the inert gas ions may be drawn to the inner surface to thereby provide sputter cleaning, wherein, e.g. about 75-100% of the surface oxides may be removed.

The interior surface of the hollow substrate may also be optionally provided with a precursor bond coat 420 which may be applied as an amorphous (non-crystalline) coupling layer as between the metallic surface and outer coating layers. Reference to a coupling layer is reference to the feature that the precursor bond coat may improve the bonding strength as between the coating layer and the substrate surface. Suitable silicon containing precursors include, e.g. silane compounds, which may be understood as the silicon analogue of an alkane hydrocarbon, of the formula $Si_nH_{2n+2}$ wherein n is an integer and may have a value of 1-10. For example, a suitable silane compound may therefore include silicon tetrahydride [$SiH_4$]. The silane compound may also include substituted aliphatic and/or aromatic functionality, e.g. methylsilane [$CH_3SiH_3$], dimethylsilane [$SiH_2(CH_3)_2$], trimethylsilane [$SiH(CH_3)_3$], tetramethylsilane [$Si(CH_3)_4$], hexamethyldisilazane (HMDSN) [[$(CH_3)_3Si]_2NH$] or hexamethyldisiloxane (HMDSO) [$O[Si(CH_3)_3]_2$]. The precursor bond coat gases may be provided in a mixture with an inert gas, such as argon. One may also employ nitrogen or hydrogen.

The gasses may be introduced into the hollow substrate through the gas feed tube at a flow rate in the range of 20 to 30 sccm, including all values and ranges therein, and a pressure in the range of 40 to 60 mTorr may be provided. Similar to the above, the bond layer may be applied at pulse frequency of from about 100 Hz to about 20 kHz may be applied, at a pulse width of about 5 microseconds to about 40 microseconds, to negatively bias the tube up to about 10 kV with respect to ground, for a period of up to about 100 minutes, including all values and ranges therein, such as 20 to 60 minutes. In addition, a voltage of 10V to 100V and 20 to 50 A may be applied to the gas feed tube through the AC power supply to heat the gas feed tube to a temperature in the range of 50° C. to 650° C. The bond coat precursor gas may form a plasma, the ions from which may be drawn to the interior surfaces of the hollow substrate forming a bond coating thereon.

Whether or not the above two steps are applied, the inner surface of the hollow substrate, i.e. an inner surface without sputter cleaning and/or a precursor bond coating, may then be exposed to a plasma containing one or more inorganic or organic gaseous precursors, which may be understood as any gas capable of forming an ion plasma, and which may then provide an inner surface wear-resistant coating or a hydrophobic/ice-phobic coating of a desired thickness and hardness 430. The plasma may be created due to the bias applied to the hollow substrate which draws ions from the plasma to the interior surface of the substrate, forming a coating on the substrate. The coatings may be applied on all or a portion of the inner surface of the hollow substrate, and may be relatively uniform in thickness, i.e. where such coating does not vary in thickness by more than about +/−20% along the length of a given hollow substrate.

As alluded to above, the coatings herein may therefore be understood to include, but not be limited to, those coatings which are termed diamond like carbon (DLC) coatings which may be understood herein as coating that contain some amount of amorphous carbon. The coatings, including the bond layer, may be applied at thicknesses in the range of about 0.1 to 30 microns, including all values and increments therein.

Exemplary precursor gasses suitable for formation of the above referenced DLC coatings on the interior surface of the hollow substrate may include hydrocarbon compounds (i.e. compounds containing carbon and hydrogen which may be provided as a gas) such as acetylene $[C_2H_2]$, ethylene $[C_2H_4]$ and/or methane $[CH_4]$, toluene $[C_7H_8]$, etc., as well as any other carbonaceous gas or relatively high vapor pressure liquid, which may be used alone or in combination with precursor gases containing an inorganic element such as the silane compounds of the general formula $[Si_nH_{2n+2}]$, silicon carbide [SiC], silane compounds including substituted aliphatic and/or aromatic functionality including hexamethyldisiloxane (HMDSO) $[O[Si(CH_3)_3]_2]$ forming Si—O-DLC, trimethyl silane $[SiH(CH_3)_3]$. In addition, the precursor gasses may also include nitrogen gas forming N-DLC coatings, or other types of organic (carbon containing) gases such as F-DLC employing fluorocarbon precursors such as perfluoropropane $[CF_3—CF_2—CF_3]$ and/or hexafluoroethane $[CF_3—CF_3]$ and combinations thereof. It is also appreciated that when the same gas such as HMDSO or trimethylsilane is used in both the bond layer deposition and the top layer deposition, only a single-layered coating is obtained.

The coatings noted above may be formed on all or a portion of the interior surface of the hollow substrate 12 illustrated in FIGS. 1 and 3. The above referenced gases may then be introduced at a flow rate of about 0.5 to 200 standard cubic centimeters per minute (sccm) while obtaining a pressure of about 0.5 to about 100 millitorr, including all values and ranges therein. For example, the gases may be introduced through the gas feed tube at a flow of about 5-75 sccm to obtain a pressure of about 20-70 millitorr which is substantially uniform throughout the hollow substrates noted above. The coating layer may then be applied at a pulse frequency of from about 100 Hz to about 20 kHz, a pulse width of about 5 microseconds to about 40 microseconds which may again negatively bias the tube up to about 10 kV with respect to ground, for a period of up to about 1500 minutes, including all values and increments therein. Furthermore, the gas feed tube may be heated during deposition upon application of an AC voltage in the range of 10V to 100V and 20 to 50 A may be applied to the gas feed tube 30 through the AC power supply to heat the gas feed tube to a temperature in the range of 50° C. to 650° C.

It may be appreciated that in heating the gas feed tube, an electrode may be provided that is now relatively clean, capable of maintaining good conductivity and uniformity of the electric field, which in turn results in relatively greater coating uniformity. In addition, arcing caused by carbon falling on the hollow substrate may be reduced or substantially eliminated, reducing pin holes in the coatings. In addition, as the center electrode/gas feed tube is not coated with carbon coatings, a thicker coating may be achieved on the interior surfaces of the hollow substrate in a shorter time period, using less current or both. Furthermore, the use of the heated gas feed tube electrode is such that it allows one to obtain relatively more uniform coatings on pipe lengths that are at or exceed about 16.5 feet. Without the heated center electrode, coating is observed to take place primarily on the ends of such pipes and soot can be observed on the pipe during deposition. It is also contemplated herein that heating of the center electrode is such that it prevents or mitigates build-up of a dielectric (non-conducting) coating on the center electrode which would otherwise adversely effect the generation of a uniform plasma.

The hollow substrate with internal surfaces coated as discussed above may be specifically incorporated into a pipeline system for the transportation of materials such as crude oil. In such a manner, a system is provided herein which incorporates at least a portion of pipeline having pipe sections that include plasma coatings on the interior surface. In addition, as noted earlier, it may be appreciated that as crude oil may contain various waxes and hydrates. The application of the coatings herein on the inside surfaces of piping that may be employed for crude oil transport may therefore provide a reduction in wax and/or hydrate build-up which may otherwise restrict oil flow.

EXAMPLES

The following examples are presented for illustrative purposes only and therefore are not meant to limit the scope of the disclosure and claimed subject matter attached herein.

Example 1

Figure 5:
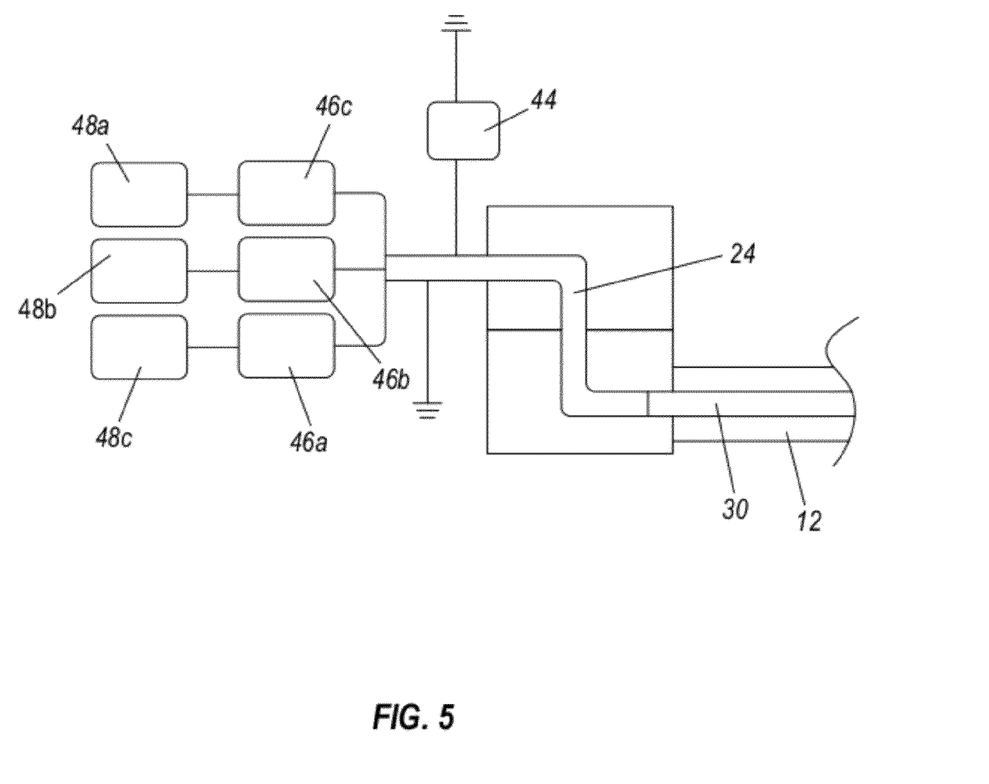
FIG. 5 illustrates a schematic of an embodiment of a gas supply system for a plasma immersion ion deposition system.

A pipe of 2.5 inches in internal diameter and 16.5 feet long made of carbon steel was provided for use in the system illustrated in FIG. 3. A gas feed tube 30 of 0.125 inches in outer diameter and 18 feet long made of stainless steel was positioned inside the hollow substrate, i.e., pipe 12 of carbon steel substantially in the center of the hollow substrate 12. In the B side vacuum chamber 22 the gas feed tube 30 was secured using a steel spring 34, which was 1.25 inches in diameter and 10 inches long with a spring constant rating of 9.2 lb/inch force. The frame 37 on which the spring 34 was mounted was also isolated from the vacuum chamber 22 using PVC as an insulating material. As illustrated in FIG. 5, the gas feed tube 30 was connected on side A to the gas supply 24, which was connected to three flow controllers 46a, 46b, 46c, wherein were in turn connected to three gas supply tanks 48a, 48b, 48c as illustrated in FIG. 5.

Referring again to FIG. 3, a spring was not used in the A side of the vacuum chamber. Rather the gas feed tube 30 was fastened on a steel cable to a come-along (hand winch) through a pulley. Both of the pulley and hand winch were secured to the A side vacuum chamber wall 36. In tightening the cable and, hence, the tubing, the spring 34 on the B side was stretched by about 4 inches to 6 inches and the gas feed tube 30 was suspended with a reduced amount of sagging. The gas feed supply 30 on the B side of the vacuum chamber 22 was plugged with plug 50, as illustrated in FIG. 3. The gas feed tube (center electrode) was made of two pieces of stainless tubings of 0.125" in diameter by 9 ft long each joined by a union fitting, on which six holes (1/64") were drilled for the gas feed. The union was loosely covered with a tantalum foil so that the gas would diffuse out and no plasma jet would form from the holes.

The hollow substrate 12 was biased using a negative pulse high voltage modulator 40. The gas feed tube 30 was heated using a variable AC transformer 44 applied to both of the gas feed lines 24 through each electric feed through 42. The end "A" was grounded to collect electrons from the plasma generated inside the hollow substrate. The applied voltage for the gas feed tube was 50V and a current of 30-35 A was obtained. The resultant power of ~1.5-1.75 kW heated the electrode to about 400-600° C. and the gas feed tube 30 was red-orange hot. During heating, additional sagging of the gas feed tube 30 was not observed. It is presumed that the force applied to the spring 34 accommodated for any additional sag that may have occurred.

Example 2

A 4 inch diameter pipe of 40 ft long was provided as a hollow substrate 12. The gas feed tube (center electrode) was made of two pieces of stainless tubings of 0.125" in diameter by 20.5 ft long each joined by a union fitting, on which six holes (1/64") were drilled for the gas feed. The union was loosely covered with a tantalum foil so that the gas would diffuse out and no plasma jet would form from the holes. Two springs 34 were used to affix the hollow substrate 12 on each side to the vacuum chambers 22 (A and B), as illustrated in FIG. 1, to suspend the gas feed tube 30. A voltage of 85 V resulting in a current of 35 A provided a temperature of 400 to 650° C. to minimize carbon deposition.

Example 3

Five tests were performed using various configurations of the gas feed tube. The temperature of the pipe was measured using a FLUKE 62 mini infrared thermometer. As may be appreciated, the temperature readings are not necessarily absolute readings in the low temperature range measured but is considered to provide a relative indicator.

Figure 6:
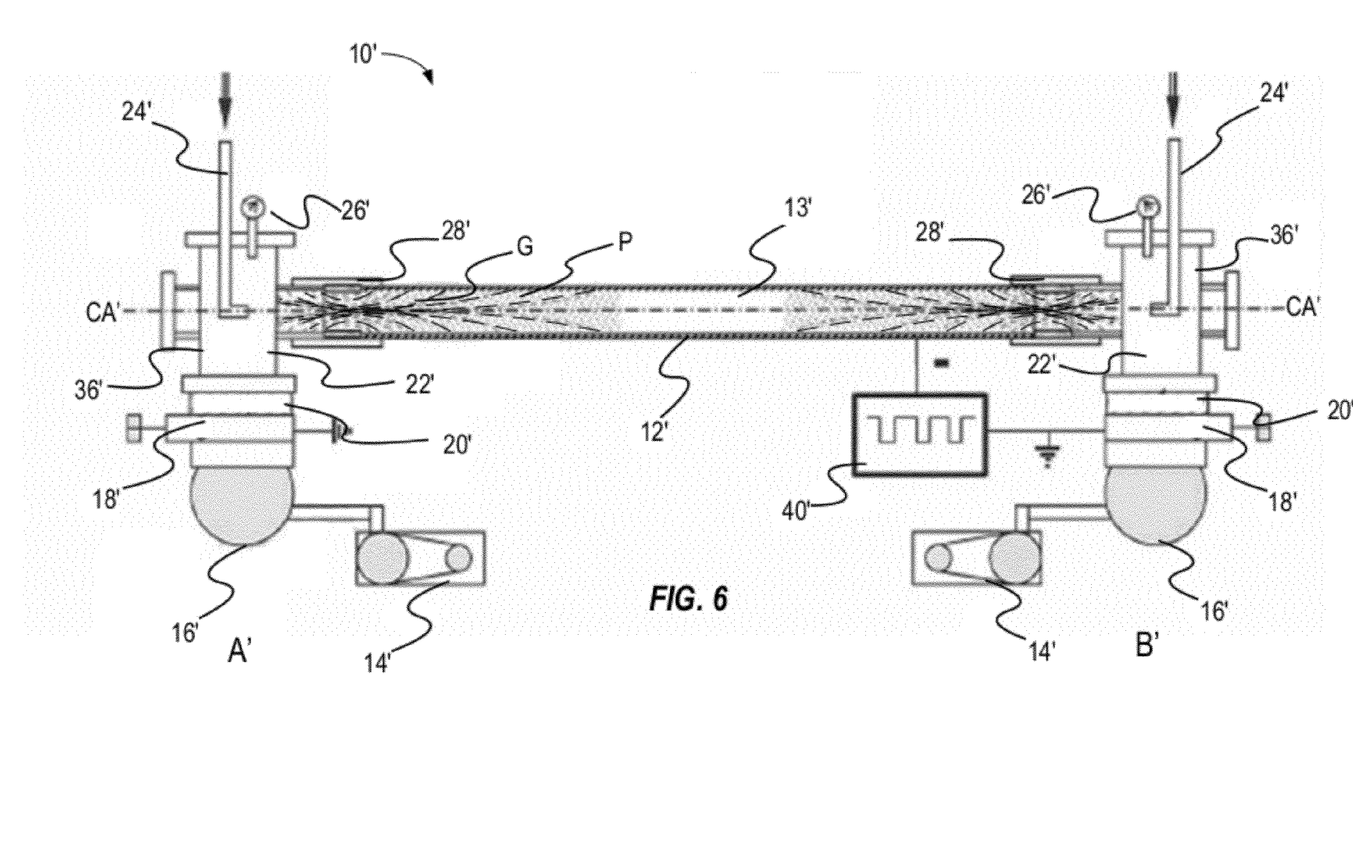
FIG. 6 illustrates a schematic of a plasma immersion ion processing system without a center electrode.

In the first test, Test 1, the system 10' illustrated in FIG. 6 was utilized wherein a gas feed tube was not provided. The system 10' is similar to that of FIGS. 1 and 2 and like items are similarly numbered with the use of "'" in the system that the gas feed tube is not provided. As a gas feed tube was not provided in the system 10' illustrated in FIG. 6, a discharge of gas G occurred at both ends of the pipe 12'. The distance of the discharge and plasma P developed therefrom appeared to extend to about 4 to 6 feet into the pipe 12', which was verified by shutting the system down and measuring the temperature of the pipe 12' by hand. Specifically, the pipe 12' appeared to be at room temperature 4 to 5 feet from the ends. The temperature of the pipe near the ends, however, was too high to touch. The phenomena was more pronounced when a long pipe (>20 ft-40 ft) was employed without a center electrode. In this case, the plasma was only generated within 4 to 6 ft from each end, while no plasma was generated at all beyond the 4-6 ft range. This was also true in the remainder of the tests described below.

In the second test, Test 2, the system illustrated in FIG. 3 was utilized wherein gas discharge was provided through a 0.125 inch in diameter stainless steel gas feed tube 30. A heating voltage, however, was not applied to the gas feed tube 30.

In the remaining tests the gas feed tube 30 was heated and the pipe length, pipe diameter and process parameters were varied. For example, in Test 3, the pipe diameter was increased and only ion etching was performed for purposes of comparison. In Test 4, the process included ion etching, bond layer deposition and DLC coating. The pipe temperatures in these tests appeared to be uniform when the voltage was shut down and the temperature was measured by hand and, therefore, heating of the center electrode appeared to help maintain temperature uniformity, even from hollow substrate lengths of up to 40 ft. It is noted that in Tests 4 and 5 it became necessary to cool the rubber hoses that were used to seal the vacuum chamber 22, electrical insulator 28 and hollow substrate 12 near the pipe ends. It is also noted that in test 5, the 33 ft pipe was obtained by connecting two 16.5 ft pipes end to end and a rubber hose was used as well to seal the pipes together. Cooling of the rubber hose was necessary at this location as well. Therefore, the temperatures in these locations were slightly lower.

Table 1 illustrates the various testing parameters and Table 2 illustrates the resulting hollow substrate temperatures that were measured along the length of the pipe.

TABLE 1

| | | | | | | |
|---|---|---|---|---|---|---|
| | | | | | Testing Parameters | |
| Test No. | Pipe Dia. (inch) | Pipe Length (ft.) | Gas Feed Tube | Gas Feed Direction | Heating Current/Voltage Of Gas Feed Tube | Process |
| 1 | 2.5 | 16.5 | No | From Both Ends | N/A | Ar ion etching |
| 2 | 2.5 | 16.5 | Yes | Center | No | Ar ion etching/Bond layer deposition/DLC coating |
| 3 | 3.0 | 16.5 | Yes | Center | 30 A/50 V | Ar ion etching |
| 4 | 2.5 | 16.5 | Yes | Center | 30 A/50 V | Ar ion etching/Bond layer deposition/DLC coating |
| 5 | 2.5 | 33.0 | Yes | Center | 34 A/80 V | Ar ion etching/Bond layer deposition/DLC coating |

TABLE 2

| | Pipe Temperatures (° C.) | | | | | | | | | | |
|---|---|---|---|---|---|---|---|---|---|---|---|
| Test No. | 1 ft from End A | 4 ft from End A | 8 ft from End A | 12 ft from End A | 1 ft from Center on A | Center | 1 ft from Center on B | 12 ft from End B | 8 ft from End B | 4 ft from End B | 1 Ft from End B |
| 1 | 52 | 32 | | | | 25 | | | | 26 | 35 |
| 2 | 27 | 27 | | | | 28 | | | | 27 | 31 |
| 3 | 35 | 33 | | | | 33 | | | | 33 | 33 |
| 4 | 32 | 40 | | | | 37 | | | | 33 | 33 |
| 5 | 35 | 44 | 41 | 40 | 27 | | 27 | 42 | 43 | 42 | 31 |

Furthermore, the processing parameters for the various tests are outlined in Tables 3 and 4 and the resultant coatings are described in Table 5. Specifically, Table 3 provides the argon etching time to remove surface oxides and contaminations on the inner surface of the hollow substrate. In addition, the bond layer deposition time, gas precursor (trimethyl silane) for the bond layer, flow rate of the gas precursor and system pressure are listed. Further, the DLC deposition time and gas precursor ($C_2H_2$-acetylene), flow rate of the DLC precursor and pressure during DLC deposition are listed.

TABLE 3

| | Processing Parameters | | | | | | |
|---|---|---|---|---|---|---|---|
| Test No. | Ar ion Clean (hr) | Bond Layer Deposit (min) | Gas/Flow Rate (sccm) | Pressure (mTorr) | DLC Deposit (h) | DLC Deposit Gas/Flow rate (sccm) | DLC Deposit Pressure (mTorr) |
| 1 | 1 | No | — | — | — | No | — |
| 2 | 2 | 20 | TMS/(22) | 50 | 6 | $C_2H_2$ (50) | 50 |
| 3 | 2 | — | — | — | — | — | 50 |
| 4 | 1 | 25 | TMS(22) | 50 | 12 | $C_2H_2$ (50) | 50-68 |
| 5 | 1.5 | 60 | TMS (22)/ AR (5) | 43-49 | 9 | $C_2H_2$ (50)/ Ar(5) | 60-25 |

Table 4 provides the pulse voltage and peak current as measured by an oscilloscope. In addition, the pulse modulator settings for the pulse frequency and pulse width are provided.

TABLE 4

| | Processing Parameters | | | |
|---|---|---|---|---|
| Test No. | Pulse Voltage (kV) | Peak Current (A) | Repet. Rate (Hz) | Pulse Width (µs) |
| 1 | — | — | — | — |
| 2 | 1.7 | 30-6 | 1000 | 20 |
| 3 | — | — | — | — |
| 4 | 2.4 | 35-19 | 1000 | 20 |
| 5 | 1.3-1.6 | 22-10 | 2000 | 20 |

The deposited pipe was cut at a few locations. Table 5 outlines the coating thickness of both the bond layer and DLC layer measured using a scanning electron microscope.

TABLE 5

| | Coating Thickness (µm) | | | | | | | |
|---|---|---|---|---|---|---|---|---|
| Test No. | 1 ft from End A | 8 ft from End A | 1 ft from Center on A | Center | 1 ft from Center on B | 8 ft from End B | 1 Ft from End B | Comments |
| 1 | — | — | — | — | — | — | — | Temp not uniform, Center Cold |

TABLE 5-continued

| | Coating Thickness (µm) | | | | | | | |
|---|---|---|---|---|---|---|---|---|
| Test No. | 1 ft from End A | 8 ft from End A | 1 ft from Center on A | Center | 1 ft from Center on B | 8 ft from End B | 1 Ft from End B | Comments |
| 2 | 8.4 | — | — | 8.3 | — | — | 12.4 | — |
| 3 | — | — | — | — | — | — | — | Test Run |
| 4 | 35.6 | — | — | 28.6 | — | — | 27.2 | — |
| 5 | 27.8 | 15.3 | 8.3 | — | 11.3 | 15.4 | 12.6 | — |

As can be seen from the above, it is noted that the addition of the center gas feed tube made it possible for the deposition of DLC coating in the deep regions (center) of the pipe. It would be otherwise impossible to coat beyond 4 to 6 ft from each end without the center electrode. Because there was no soot accumulation, heating the center electrode provided for longer deposition durations, which extended up to 12 hours, such as 10 minutes to 12 hours including all values and ranges therein, such as from 1 hour to 12 hours, etc., providing for a thicker coating and a relatively higher deposition rate was observed. Test No. 5 illustrates that even longer pipes (33 ft) was able to be deposited using these methods.

Figure 7A:
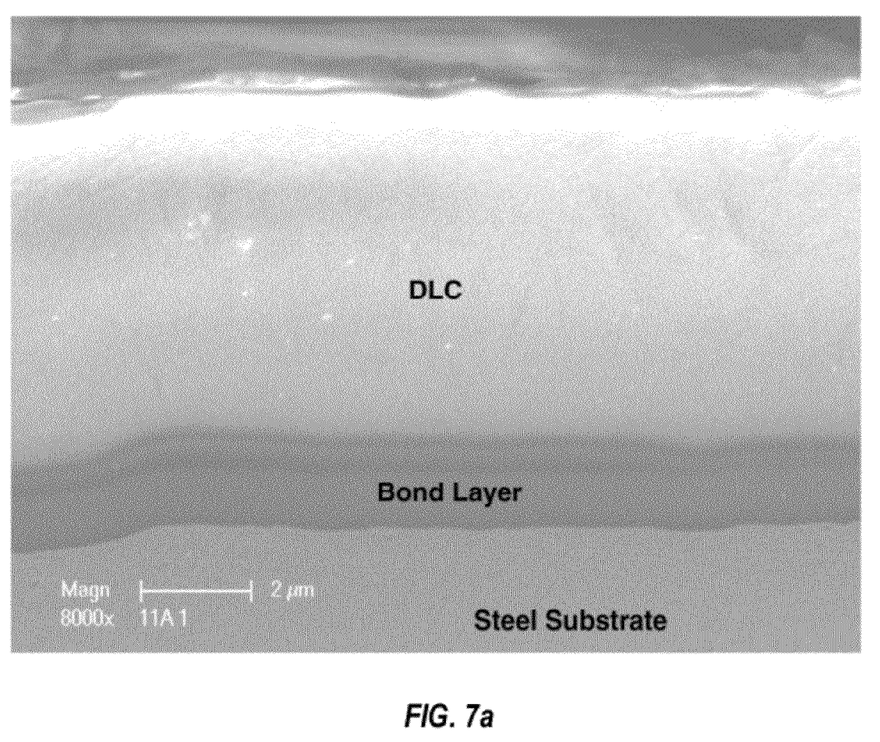
FIG. 7a illustrates a scanning electron microscope image of the DLC coating applied on a pipe in Test 2, wherein the magnification is 8000× and the scale is 2 μm.
Figure 7B:
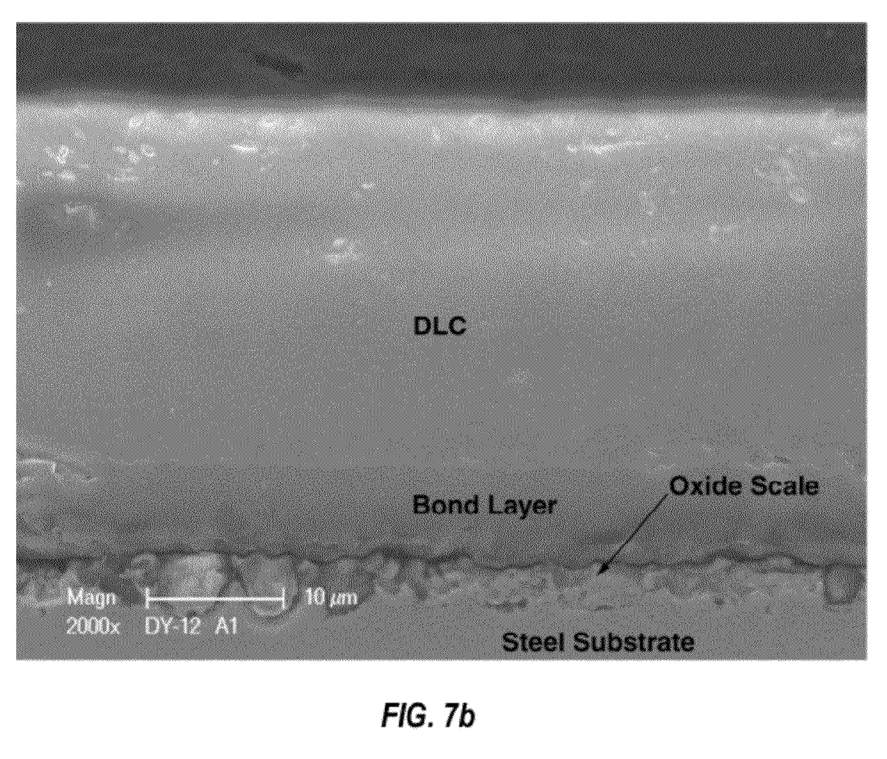
FIG. 7b illustrates a scanning electron microscope image of the DLC coating applied on a pipe in Test 4, wherein the magnification is 2000× and the scale is 10 μm.
Figure 8A:
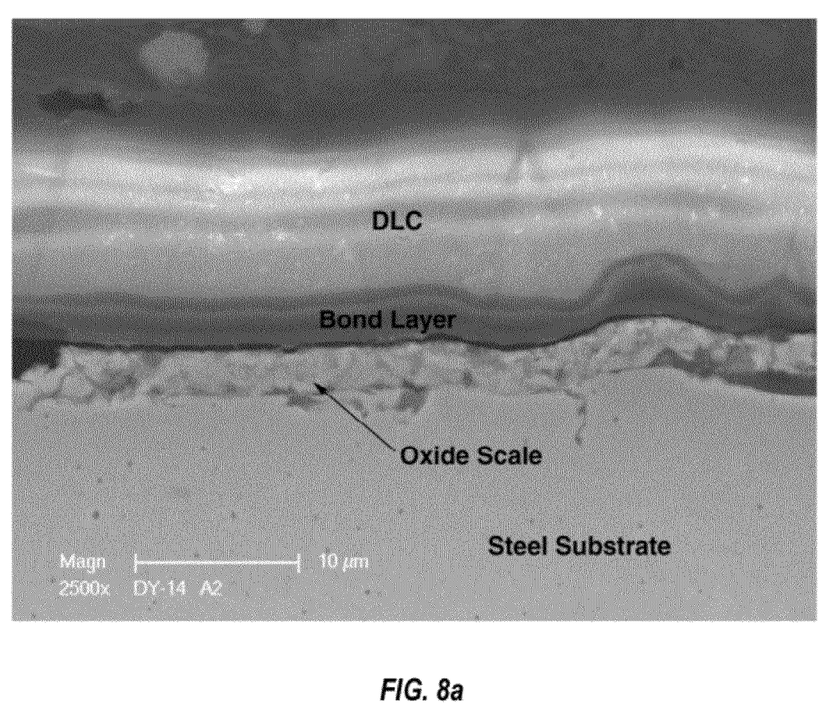
FIG. 8a illustrates a scanning electron microscope image of the DLC coating applied on a pipe in Test 5, wherein the magnification is 2500× and the scale is 10 μm.
Figure 8B:
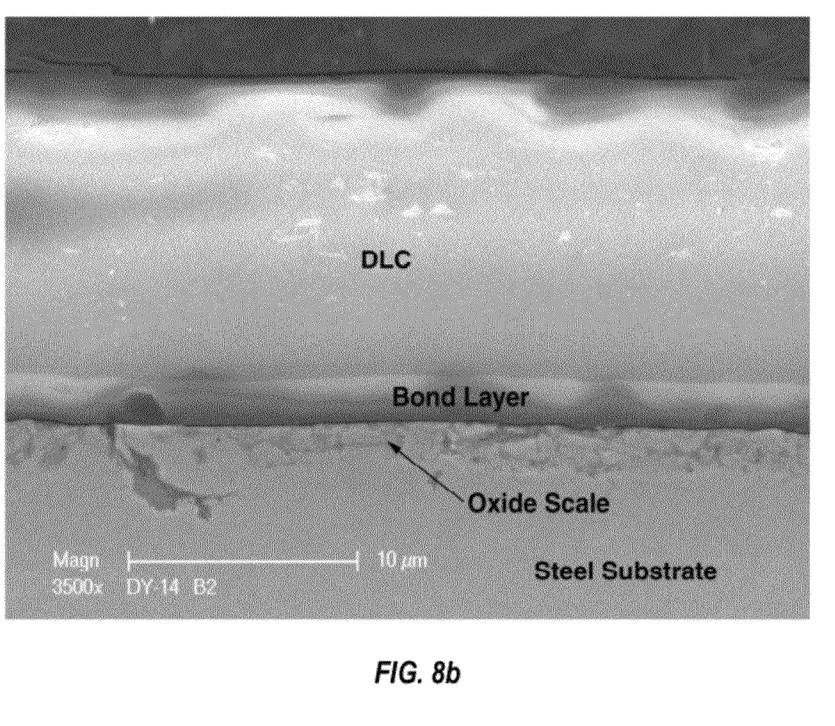
FIG. 8b illustrates a scanning electron microscope image of a DLC coating applied on a pipe in Test 5, wherein the magnification is 3500× and the scale is 10 μm.

FIGS. 7 and 8 illustrate scanning electron microscope images of the diamond like carbon deposited on the pipes. The bilayered structure is illustrated including a silicon carbide bond layer and a diamond like carbon layer. Specifically, FIG. 7a illustrates a DLC coating on a 16.5 ft steel pipe from Test number 2 and FIG. 7b illustrates a DLC coating on a 16.5 ft pipe from Test number 4. FIGS. 8a and 8b illustrate images of a DLC coating on a 33 ft steel pipe from Test number 5, wherein FIG. 8a was 8 ft from End A and FIG. 8b was 8 ft from end B. As may be appreciated, if the surface of the pipe is smooth (as illustrated in FIG. 7a), free from surface oxide, the coating may adhere well to the steel. If the steel surface has a loose structure (such as the oxide scale illustrated in FIG. 7b, FIG. 8a and FIG. 8b) presumably from the steel milling/hollow pipe extrusion process, the coating adhesion may be compromised. Polishing and/or honing may improve the coating/pipe interface quality.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A method for plasma immersion ion processing, comprising:
   providing a hollow substrate having an interior surface defining an interior and a gas feed tube extending through said interior, wherein said gas feed tube is hollow and includes a wall having a plurality of holes or diffusers defined therein;
   applying tension to said gas feed tube by affixing a first spring to one end of said gas feed tube and said vacuum chamber;
   heating said gas feed tube to a temperature in the range of 50° C. to 650° C.;
   supplying a precursor gas to the interior of said hollow substrate through said plurality of holes or diffusers in said gas feed tube and generating a plasma; and
   applying a negative bias to said hollow substrate relative to said gas feed tube to draw ions from said plasma to said interior surface to form a coating on said interior surface.

2. The method of claim 1, wherein said hollow substrate is up to 80 feet in length and said gas feed tube is at least as long as said hollow substrate.

3. The method of claim 1, wherein said gas feed tube has a diameter of 0.1 inches to 0.5 inches.

4. The method of claim 1, further comprising applying tension to said gas feed tube by affixing a second spring to an opposing end of said gas feed tube and said vacuum chamber.

5. The method of claim 1, further comprising supplying an inert gas to said interior of said hollow substrate, forming plasma of said inert gas, and cleaning said interior surface.

6. The method of claim 1, wherein said negative bias is a negative voltage of up to 10 kV having a pulse frequency of 100 Hz to 20 kHz at a pulse width of 5 microseconds to 40 microseconds.

7. The method of claim 1, wherein said precursor gas comprises hydrocarbon compounds selected from the group consisting of acetylene, ethylene, methane, toluene or combinations thereof.

8. The method of claim 1, wherein said precursor gases are selected from one or more of the following: a) silane compounds of the general formula $[Si_nH_{2n+2}]$ or b) silane compounds including substituted aliphatic and/or aromatic functionality.

9. The method of claim 1, further comprising supplying a bond coat precursor gas to the interior of said hollow substrate through said gas feed tube, generating a plasma of said bond coat precursor gas and forming a bond coat on said interior surface of said hollow substrate.

10. The method of claim 9, wherein said bond coat precursor gas comprises a silane compound.

* * * * *